United States Patent [19]

Shimizu et al.

[11] Patent Number: 4,786,959
[45] Date of Patent: Nov. 22, 1988

[54] GATE TURN-OFF THYRISTOR

[75] Inventors: Yoshiteru Shimizu, Katsuta; Takahiro Nagano, Hitachi; Shuroku Sakurada, Hitachi; Takehiro Ohta, Hitachi, all of Japan

[73] Assignee: Hitachi, Ltd., Tokyo, Japan

[21] Appl. No.: 308,614

[22] Filed: Oct. 5, 1981

Related U.S. Application Data

[63] Continuation of Ser. No. 164,944, Jul. 1, 1980.

[30] Foreign Application Priority Data

Jul. 6, 1979 [JP] Japan ................................. 54-84964

[51] Int. Cl.[4] .......................................... H01L 29/74
[52] U.S. Cl. ....................................... 357/38; 357/20; 357/36; 357/56
[58] Field of Search .................... 357/38, 20, 56, 36

[56] References Cited

U.S. PATENT DOCUMENTS

| 4,243,999 | 1/1981 | Azuma et al. | 357/38 |
| 4,356,503 | 10/1982 | Shafer et al. | 357/38 |

FOREIGN PATENT DOCUMENTS

| 14098 | 8/1980 | European Pat. Off. | 357/38 G |
| 52-2287 | 1/1977 | Japan | 357/38 G |
| 54-13274 | 1/1979 | Japan | 357/38 G |
| 54-37589 | 3/1979 | Japan | 357/38 G |

*Primary Examiner*—Joseph E. Clawson, Jr.
*Attorney, Agent, or Firm*—Antonelli, Terry & Wands

[57] ABSTRACT

A semiconductor substrate of the shape of a disc possesses a first main surface and a second main surface. The semiconductor substrate consists of an emitter layer on the side of the cathode, a second base layer, a first base layer, and an emitter layer on the side of the anode, which are laminated in the order mentioned from the side of the cathode toward the side of the anode. The circumference of the emitter layer on the anode side is short-circuited by an emitter short-circuiting layer on the anode side. On the second main surface is arrayed the emitter layer on the cathode side being divided into a plurality of strip units which are oriented in a radial manner from the center toward the periphery of the semiconductor substrate. The second base layer is exposed on the other portions on the second main surface. The emitter layers on the anode side are provided in the portions where the emitter layers on the cathode side are projected onto the anode side. The emitter short-circuiting layer on the anode side forms a plurality of fan-shaped portions which are oriented in a radial manner from the center toward the periphery of the semiconductor substrate so that the area per unit length in the radial direction of the emitter short-circuiting layer increases from the center toward the periphery. The emitter layers on the anode side and the emitter short-circuiting layers on the anode side are exposed to the first main surface, and are brought into contact with the anode electrodes. The emitter layers on the cathode side are in contact with the cathode electrodes, respectively. The second base layer is in contact with the control electrode, and a lead wire is connected to a central portion of the circular control electrode.

12 Claims, 5 Drawing Sheets

GATE TURN-OFF THYRISTOR

This is a continuation of application Ser. No. 164,944, filed July 1, 1980.

BACKGROUND OF THE INVENTION

The present invention relates to a semiconductor device and more specifically to the construction of a gate turn-off thyristor (hereinafter referred to as GTO thyristor).

A GTO thyristor of the PNPN four-layer construction with a control electrode is capable of controlling large quantities of electric power as compared with the transistors. There has in the past been proposed a GTO thyristor equipped with an emitter short-circuiting layer on the anode side to enhance the self-turn-off ability. A semiconductor switch of the type in which the emitter is short-circuited on the anode side has been taught, for example, in FIGS. 6 and 7 of U.S. Pat. No. 3,239,728.

It has, however, been desired to produce a GTO thyristor of the type in which the emitter on the anode side is short-circuited and in which the connection points between the control electrode and the lead wire connected to the control electrode is minimized to as great an extent as possible. The width of the control electrode is in the order of several hundreds of um. Therefore, the portions remote from the connection point exhibits increased electric resistance which causes the turn-off time to be lengthened. Furthermore, the increase in the electric resistance makes it difficult to emit the carriers accumulated in the GTO thyristor to the external circuit via a lead wire when the GTO thyristor is turned off; i.e., the increase in the electric resistance makes it difficult to extract the accumulated carriers. This presents a serious hindrance when it is attempted to make GTO thyristors of large capacities.

SUMMARY OF THE INVENTION

The object of the present invention is to provide a gate turn-off thyristor which is designed to improve the turn-off time.

Another object of the present invention is to provide a gate turn-off thyristor by which the capacity can be easily increased.

In order to achieve the above-mentioned objects, the thyristor of the present invention is constructed as described below. Namely, second outer semiconductor layers (emitter layers on the cathode side) of a strip shape are radially formed on one main surface of a circular semiconductor substrate. Further, an external lead wire is connected to the center on one main surface, i.e., connected to the center of the control electrode which is formed on the second inner semiconductor layer (second base layer) which is exposed on one main surface. Namely, the gate turn-off thyristor of the present invention is based upon a center gate construction.

On the other main surface of the semiconductor substrate are provided first outer semiconductor layers (emitter layers of the anode side) of a strip form at portions where the emitter layers of the cathode side are projected. On the other main surface excluding the emitter layer of the anode side, a short-circuiting emitter construction is formed by a portion (emitter short-circuiting layer) of a first fan-shaped inner semiconductor layer.

According to the present invention which is based upon the center gate construction as mentioned above, the non-uniformity in turn-off time in a GTO unit which is caused by the cathode-side emitter layer which is formed in a strip and radial manner, is compensated by reducing the turn-off time by providing an anode-side emitter short-circuiting layer as will be mentioned later. Therefore, uniform turn-off time can be accomplished throughout the semiconductor substrate irrespective of whether the GTO unit may reside in the central or peripheral site. Accordingly, the gate turn-off function is uniformly effected throughout the entire semiconductor substrate.

When the GTO thyristor is turned off, therefore, the carriers can be extracted without difficulty, and the current which flows through the semiconductor substrate does not concentrate in the substrate. Consequently, the GTO thyristor is not thermally destroyed, and a large capacity can be obtained.

DESCRIPTION OF THE PREFERRED EMBODIMENTS

With the emitter short-circuited GTO thyristor having a small emitter short-circuiting resistance, the carriers accumulated in the first base layer can be quickly driven into the emitter short-circuiting layer when the emitter short-circuited GTO thyristor is turned off, to shorten the turn-off time. If the emitter short-circuiting resistance is decreased, however, the amount of hole injection from the emitter junction $J_1$ on the anode side into the first base layer is reduced when the emitter short-circuited GTO thyristor is turned on. Therefore, the turn-on voltage is increased and a major portion of the current of the emitter short-circuited GTO thyristor becomes a short-circuit current, so that the GTO thyristor is no longer capable of retaining the conductive state.

An optimum value resides in the emitter shortcircuiting resistance which determines the emitter short-circuiting effect. Namely, the emitter shortcircuiting resistance $R_{SO}$ is given by the following relation (1).

$$R_{SO} = K\rho nW \quad (1)$$

where K denotes the shape factor of the emitter pattern, $\rho n$ denotes the resistivity of the first base layer, and W denotes the thickness of the first base layer.

Figure 1:
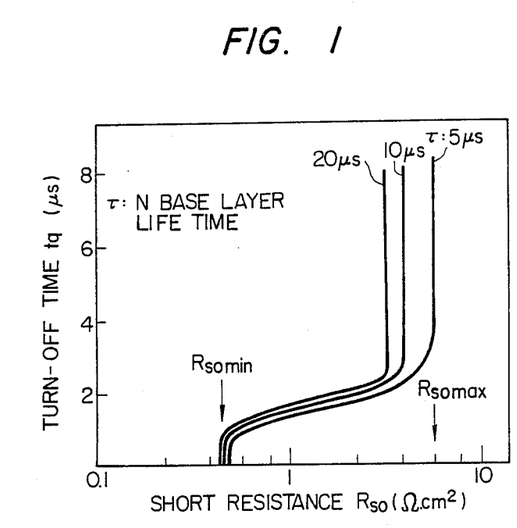
FIG. 1 is a diagram illustrating relations between the emitter short-circuited resistance $R_{SO}$ and the turn-off time $t_q$ of an emitter short-circuited GTO thyristor.

FIG. 1 shows a relation between the emitter short-circuiting resistance $R_{SO}$ and the turn-off time $t_q$ with the life time of carriers in the first base layer as a parameter, in which $R_{SOmin}$ represents the minimum value at which the emitter short-circuited GTO thyristor can retain the conductive state, and $R_{SOmax}$ represents the maximum value at which the GTO thyristor is allowed to be turned off. Thus, there exists a width in the emitter short-circuiting resistor $R_{SO}$ in which the thyristor is allowed to operate as an element.

Therefore, the shapes, resistivities and thicknesses of the emitter layer on the side of the anode and the emitter short-circuiting layer are determined so that the GTO thyristor is allowed to operate within a given range.

With the conventional emitter short-circuited GTO thyristor, however, the turn-off time becomes non-uniform in the same GTO unit as mentioned above even when the shapes and the like of the emitter layer on the side of the anode and the emitter short-circuiting layer are determined, and it is difficult to realize an emitter short-circuited GTO thyristor having a large capacity.

Figure 2:
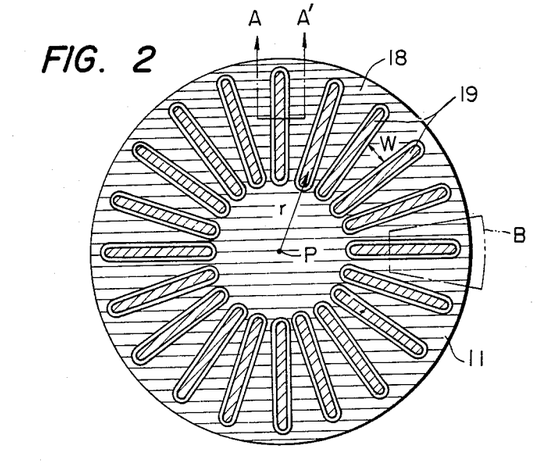
FIG. 2 is an upper view for illustrating a pattern on the side of the cathode of the GTO thyristor according to the present invention.

FIG. 2 shows a fundamental pattern on the side of the cathode of the GTO thyristor of the type in which the emitter on the side of the anode is short-circuited according to the present invention. A semiconductor substrate 11 is formed in a circular shape. As will be mentioned later, the emitter layer on the side of the cathode, which serves as a second outer semiconductor layer, is formed in a strip shape and in a radial manner. Cathode electrodes 19 are formed on the emitter layer on the side of the cathode. Similarly, a control electrode 18 is formed on a second base layer which serves as a second inner semiconductor layer as will be mentioned later and which is exposed on the main surface on the side of the cathode. A connection point P which connects to an external lead wire that will be mentioned later is formed at the center of the control electrode 18, i.e., formed at the center of the semiconductor substrate 11. Accordingly, the GTO thyristor of the present invention is based upon a so-called center gate construction. In the GTO thyristor shown in FIG. 2, 20 cathode electrodes 19 are formed. In other words, the GTO thyristor has 20 GTO units.

Figure 3:
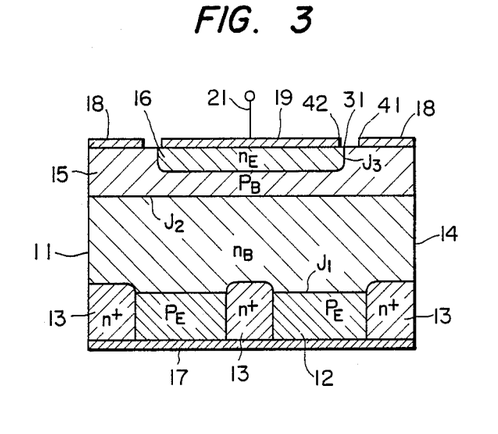
FIG. 3 is a partial cross-sectional view of a GTO unit of the GTO thyristor according to the present invention.

FIG. 3 is a cross-sectional view of a GTO unit when the GTO thyristor of FIG. 2 is cut along the line A—A'. The GTO thyristor consists of a semiconductor substrate 11 having two main surfaces, an anode electrode 17, a cathode electrode 19, and a control electrode 18.

The semiconductor substrate 11 consists of four layers, i.e., a first outer semiconductor layer or an emitter layer 12 on the side of the P-type (or N-type) anode, a first inner semiconductor layer or a first N-type (or P-type) base layer 14, a second inner semiconductor layer or a second P-type (or N-type) base layer 15, and a second outer semiconductor layer or an emitter layer 16 on the side of the N-type (or P-type) cathode. Further, in the embodiment of FIG. 3, a portion of the first base layer 14 is brought into contact with an anode electrode 17 via an emitter short-circuiting layer 13 of the N+-type (or P+-type) anode. The anode electrode 17 is also brought into contact with the emitter layer 12 on the side of the anode. The second base layer 15 and the emitter layer 16 on the side of the cathode are, respectively, brought into contact with the control electrode 18 and the cathode electrode 19.

If illustrated in further detail, the emitter layer 16 on the side of the cathode constitutes a socalled planar junction in which an end of PN junction 31 is exposed on the upper main surface of the semiconductor substrate 11. The emitter layer 12 on the side of the anode is formed in a portion where the emitter layer 16 on the side of the cathode is projected onto the anode side at the exposed end 31 of the PN junction. In the embodiment of FIG. 3, furthermore, an emitter short-circuiting layer 13' is formed in a portion where the emitter layer 16 on the side of the cathode is projected onto the anode side. Reference numeral 21 denotes a lead wire connected to the cathode electrode 19. Reference numerals 41 and 42 denote end portions of the control electrode 18 and the cathode electrode 19, respectively. Symbols $J_1$, $J_2$, and $J_3$ denote PN junction portions.

The fundamental principle of the operation of the GTO unit shown in FIG. 3 is mentioned below. Namely, the provision of the emitter short-circuiting layer 13 on the side of the anode causes the current amplification factor (alpha) of the transistor portion having the emitter layer 12 of the anode side to be substantially decreased, and enables the carriers accumulated in the first base layer 14 to be driven into the anode electrode 17. Therefore, as mentioned in connection with the aforementioned relation (1), the carriers in the first base layer 14 can be quickly extinguished when the gate signal far gate turn-off is applied to obtain good turn-off characteristics even when the life time of the carriers in the first base layer 14 is long, by suitably selecting the emitter short-circuiting resistance $R_{SO}$ in accordance with the relation (1). Furthermore, the carriers accumulated in the first base layer 14 in the GTO thyristor of the present invention can be driven away more quickly if the emitter layer 16 on the side of the cathode and the emitter short-circuiting layer 13 on the side of the anode in the GTO thyristor are formed in predetermined shapes, and if the lead wire connected to the control electrode 18 is provided at a predetermined position, as will be mentioned later.

In order to produce elements having increased blocking voltage as well as increased current capacity, it is recommended to employ a circular semiconductor substrate as shown in FIG. 2 so that the electric field is not increased in the periphery and the effective area of the element is increased.

Below is mentioned the setup of the GTO thyristor of the present invention which features improved turnoff characteristics and increased capacity.

Here, the electric resistance of the control electrode 18 is discussed.

When the external lead wire that will be mentioned later is provided at the center P of the control electrode 18 of the GTO thyristor 11 shown in FIG. 2, the width W of the control electrode 18 between the GTO units is about several hundred μm, and the electric resistance in the lengthwise direction (radial direction r in the semiconductor substrate 11) is no longer negligible.

Figure 4:
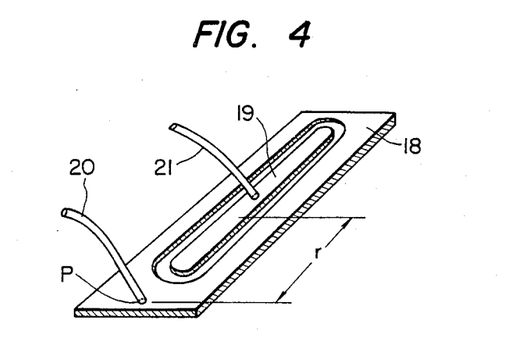
FIG. 4 is a diagram illustrating the construction for extending the gate lead wire of the GTO thyristor of the present invention.

In general, the gate lead is taken out to the external side by welding an external lead wire 20 onto a portion of the control electrode 18 as shown in FIG. 4. The degree for extracting the accumulated carrier from the second base layer 15 changes with the change in the distance r between the connection portion where the external lead wire 20 is welded onto the control electrode 18 and a predetermined position of the control electrode. The turn-off time tends to be lengthened with the increase in the distance r from the external lead wire.

Figure 5:
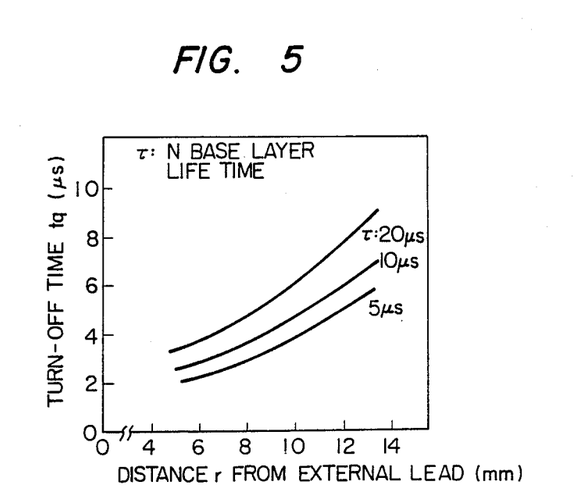
FIG. 5 is a diagram illustrating the turn-off times when the emitter layer on the cathode side is formed in a rectangular and radial manner in the GTO thyristor of the present invention.

FIG. 5 is a diagram showing relations between the distance r from the connection point P in the GTO unit and the turn-off time of the GTO thyristor shown in FIG. 2. As will be obvious from FIG. 5, the turn-off time (μS) of the GTO thyristor increases with the increase in the distance r (mm) from the connection point P, though it slightly varies depending upon the life time of the first base layer. Accordingly, the turn-off time of the first base layer 14 which is remote from the connection point P is longer than those of the portions which are close to the connection point P.

On the other hand, the emitter layers 12 on the side of the anode are formed close to the emitter layers 16 on the side of the cathode at portions where the emitter layers 16 of strip and radial form are projected. The emitter layers 12 on the side of the anode have also been formed in a strip and radial manner.

Figure 7:
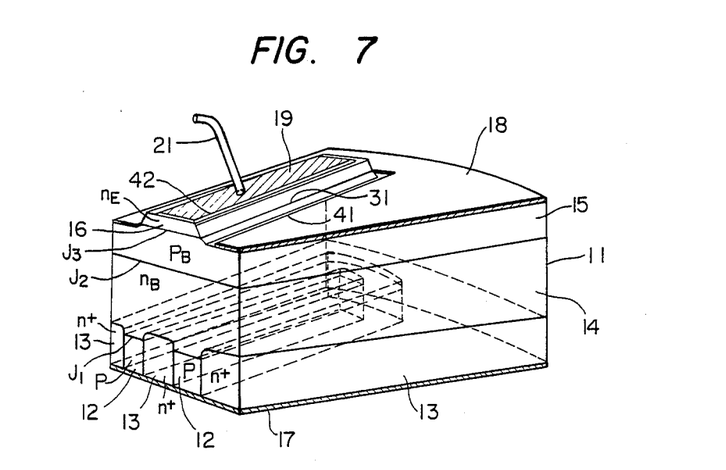
FIG. 7 is a cross-sectional perspective view of the GTO thyristor of the present invention.

As will be understood from FIG. 7, therefore, the emitter short-circuiting layer 13 on the side of the anode has a fan-shape at portions along the emitter layer 12 respectively of which the area per unit length increases from the center toward the periphery of the semiconductor substrate 11. The increase in the area per unit length of the emitter short-circuiting layer 13 is proportional to the decrease in the resistance of the emitter short-circuiting layer 13, and presents an increased emitter short-circuiting effect.

As mentioned already, as the emitter short-circuiting effect increases, the effect for extracting the accumulated carriers can be increased correspondingly so that the turn-off time is shortened.

Figure 6:
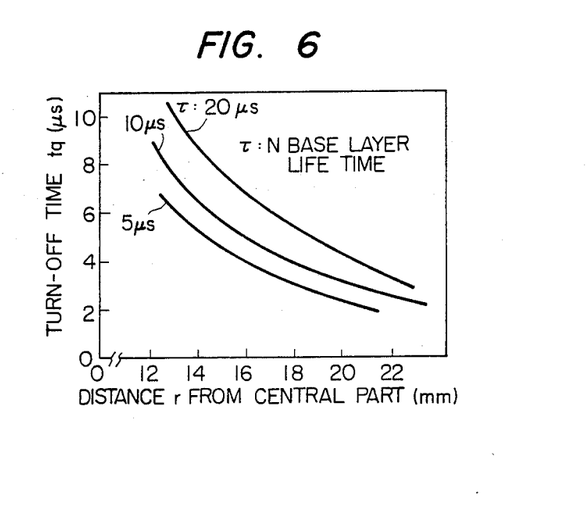
FIG. 6 is a diagram illustrating the turn-off times when the emitter short-circuiting layer on the anode side is formed in a fan shape in the GTO thyristor of the present invention.

FIG. 6 is a diagram illustrating relations between the distance r (mm) from the center of the semiconductor substrate 11 toward the periphery thereof and the turn-off time $t_q$ (μS) based upon the emitter shortcircuiting effect with the life time of carriers in the first base layer 14 as a parameter. As will be obvious from FIG. 6, the turn-off time $t_q$ decreases with the increase in the distance r, and the emitter short-circuiting layer 13 on the side of the anode of the present invention exhibits characteristics which are contrary to the characteristics shown in FIG. 5.

Therefore, by compensating the characteristics shown in FIG. 5 which stem from the emitter layers 16 which are formed in a strip form and in a radial manner on the side of the cathode by the characteristics shown in FIG. 6 which stem from the emitter shortcircuiting layers 13 which are formed in a strip form and in a radial manner on the side of the anode, it is possible to obtain uniform turn-off time at any positions of the semiconductor substrate 11 irrespective of the central or the peripheral portions. Consequently, with the GTO thyristor of the present invention, the gate can be turned off uniformly throughout the entire semiconductor substrate 11.

Accordingly, the current does not flow in a concentrated manner when the gate is turned off, and the element is not thermally destroyed.

Hence, the turn-off time of the semiconductor substrate 11 is determined by suitably selecting the width W and length of the control electrode 18, and the emitter short-circuiting resistance $R_{SO}$.

FIG. 7 is a perspective view of a GTO unit which is surrounded by the lines as denoted by B in FIG. 2, in which the same portions or the equivalent portions as those of FIGS. 2 and 3 are denoted by the same reference numerals.

In FIG. 7, the external lead wire 20 is connected onto the control electrode 18 at its central position which is not diagramatized, in a manner as shown in FIG. 4. Steps are formed by etching in the main surfaces of the second base layer 15 and the emitter layer 16 on the side of the cathode. A PN junction 31 formed by the second base layer 15 and the emitter layer 16 is exposed to a stepped portion (mesa portion). The emitter layers 12 on the side of the anode are present in the portions where the exposed ends are projected toward the anode side. Since the emitter layers 12 on the anode side are formed in nearly the same shape as the emitter layers 16 on the cathode side which are formed in a strip shape and in a radial manner, the area per unit length in the radial direction of the emitter short-circuiting layer 13 increases from the center toward the periphery.

Embodiments of the invention will now be illustrated below.

The semiconductor substrate 11 has a diameter of 30 mm, and the silicon wafer which is a starting material has a resistivity of 50 ohms.cm and a thickness of 0.3 mm. The emitter layer 12 on the anode side, the emitter short-circuiting layer 13, the second base layer 15 and the emitter layer 16 on the cathode side have impurity concentrations of $5 \times 10^{18}$, $1 \times 10^{20}$, $5 \times 10^{18}$, and $1 \times 10^{20}$ atoms/cm$^3$, respectively, in the surfaces.

The emitter layers 16 on the cathode side are formed in a radial manner starting from a position of one-half the radius of the semiconductor substrate 11, and have a width of 200 μm and a length of 7 mm. The emitter layers 12 on the anode side, on the other hand, have a width of 200 μm and a length of 7.5 mm. The emitter short-circuiting layers 13 have a width of about 0.6 mm at a portion close to the center and a width of about 1.7 mm at the peripheral portion within a fan-shaped portion, as well as a width of 0.03 mm at a portion immediately below the emitter layers 16 on the cathode side. These lengths are all as measured in the portions where the emitter layers 16 on the cathode are projected. 72 GTO units are formed in the semiconductor substrate 11.

The turn-off time of the thus constructed GTO thyristor was 3 μS at a rated current of 300 amp.

Figure 8:
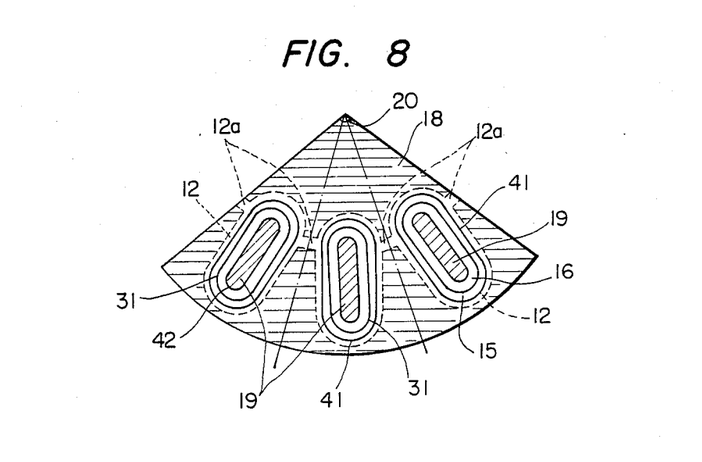
FIG. 8 is a plan view of a thyristor containing three GTO units when the anode side is viewed from the cathode side, which is a modified embodiment of the GTO thyristor of the present invention.

FIG. 8 illustrates another embodiment according to the present invention, i.e., shows a pattern of three GTO units on the anode side.

In other words, FIG. 8 is a perspective plan view of a thyristor having three GTO units when the side of the anode is viewed from the side of the cathode. Solid lines indicate semiconductor layers 15, 16 on the cathode side, as well as electrodes 18, 19. Dotted lines indicate semiconductor layers 12 on the side of the anode and short-circuiting portions 12a.

In the embodiment shown in FIG. 7, the emitter layers 12 on the anode side are separated independently of each other. In the embodiment of FIG. 8, however, the emitter layers 12 on the anode side in each of the GTO units are connected together through the shortcircuiting portion 12a.

Therefore, when a gate signal for switch on is applied, a given GTO unit is rendered conductive and the conductive state is then spread to other GTO units through the short-circuiting portions 12a, so that the semiconductor substrate 11 is quickly turned on.

FIG. 8 shows that the width of the emitter layer 16 is substantially constant along its length.

In FIG. 8, furthermore, lines 31 denote positions at which an end of the PN junction formed by the second base layer 15 and the emitter layer 16 on the cathode side is exposed to the main surface on the cathode side, and reference numeral 20 represents a point at which the external lead wire is connected to the control electrodes.

Diagrams (a) to (c) of FIGS. 9A, 9B and 9C illustrate modified embodiments of the main surface on the side of the cathode.

Namely, the diagram (a) shows an example in which an end of the PN junction formed by the second base layer 15 and the emitter layer 16 on the cathode side is exposed to a flat main surface on the side of the cathode, the diagram (b) shows an example in which the end of the PN junction is exposed to the main surface which has stepped portions, and the diagram (c) shows an example in which stepped portions are formed in the main surface, and the end of the PN junction is exposed to the stepped portions.

Figure 9:
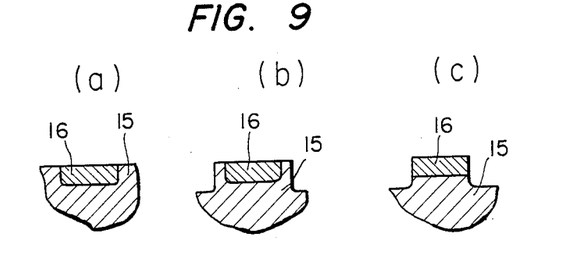
FIGS. 9A, 9B and 9C are cross-sectional views of a portion of cathode in the GTO thyristor of the present invention.

In the cases of the diagrams (b) and (c) of FIG. 9, the electrode post on the cathode side can be forcibly contacted to the emitter layer 16 on the cathode side, and the second base layer 15 can be easily insulated from the emitter layer 16.

Figure 10:
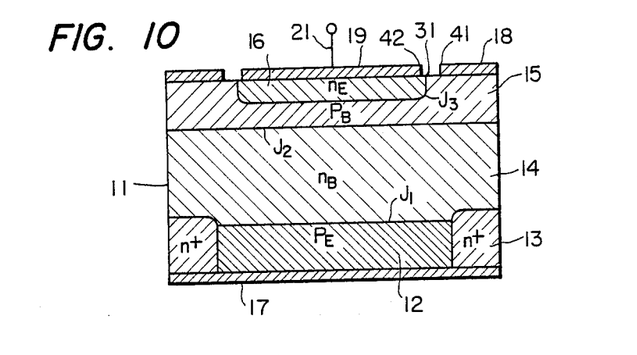
FIG. 10 is a vertical cross-sectional view of a GTO unit, which is a further modified embodiment of the GTO thyristor of the present invention.

FIG. 10 illustrates a modified embodiment of the semiconductor layer between the emitter layers 12 and 16.

According to this embodiment, the emitter layer 12 on the anode side exists in the entire areas onto which the emitter layer 16 on the cathode side is projected.

The GTO thyristor shown in FIG. 10 is suitable when the emitter layer 16 on the cathode side has a small width.

The pattern of the anode side will be determined depending upon the requirement of turn-off time $t_q$ and the emitter short-circuiting resistance $R_{SO}$ as mentioned earlier.

Figure 11:
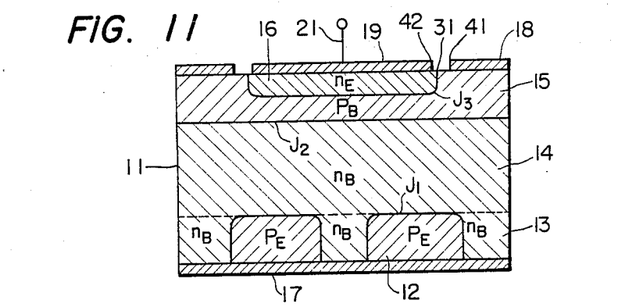
FIG. 11 is a cross-sectional view of a GTO unit, according to a still further embodiment of the GTO thyristor of the present invention.

FIG. 11 illustrates a further embodiment in which the first base layer 14 and the emitter short-circuiting layer 13 on the anode side have the same type of conductivity as well as the same impurity concentration. The GTO thyristor of FIG. 11 is suitable when the emitter layer 16 on the cathode side has a large width.

According to the present invention as illustrated in the foregoing, the accumulated carriers are uniformly extracted throughout the entire surface of the semiconductor substrate, so that the device can be turned off uniformly without causing the current to be concentrated at a given portion only, and enabling good turn-off operation to be accomplished.

Further, since the electric current does not concentrate in a given portion in the semiconductor substrate, the capacity of the GTO thyristor can be easily increased.

What is claimed is:

1. A gate turn-off thyristor which comprises:
   (a) a semiconductor substrate having a pair of opposing major surfaces which comprises:
      (i) a plurality of first emitter regions of one conductivity type exposed to one of said major surfaces exposed area, said first emitter regions having strip-shapes on said one major surface, and being separated from one another in said substrate;
      (ii) a plurality of second emitter regions of opposite conductivity type to said first emitter regions exposed to the other of said major surfaces, and having portions of strip-shapes which overlap respectively projections of said first emitter regions onto said other major surface;
      (iii) a first base region of said opposite conductivity type adjacent to said first emitter regions and exposed to said one major surface so as to surround the exposed surface of said first emitter regions; and
      (iv) a second base region of said one conductivity type adjacent to said first base region and said second emitter regions, and exposed to said other major surface so as to surround exposed surfaces of said second emitter regions and so as to have a portion where an area of the exposed surface of said second base region is increased in a substantially continuous manner along a longitudinal direction of at least one of said strip-shaped portions of said second emitter regions from one portion close to one side of a terminal edge of said at least one strip-shaped portion of said second emitter regions to another portion close to another side of said terminal edge of said at least one strip-shaped portion of said second emitter regions,
   (b) a plurality of first main electrodes disposed on said one major surface of said semiconductor substrate in ohmic contact with the exposed surfaces of said first emitter regions;
   (c) a second main electrode disposed on said other major surface of said semiconductor substrate in ohmic contact with the exposed surfaces of said second emitter regions and said second base region; and
   (d) only a single gate electrode disposed on said one major surface in ohmic contact with the exposed surface of said first base region, to which gate electrode an external gate wire is to be electrically connected at at least one corresponding portion of said gate electrode close to said one side of terminal edges of said second emitter regions.

2. A gate turn-off thyristor as claimed in claim 1, wherein said first emitter regions are arranged radially, and said second base region is exposed to said other major surface so as to increase the area of the exposed surface in a substantially continuous manner along a longitudinal direction of said at least one strip-shaped portion of said second emitter regions from a portion close to a center of said radial arrangement to another portion close to a periphery of said radial arrangement.

3. A gate turn-off thyristor as claimed in claim 2, wherein said pair of major surfaces of the semiconductor substrate have circular shapes, respectively.

4. A gate turn-off thyristor as claimed in claim 1, wherein said semiconductor substrate comprises a plurality of semiconductor regions of said one conductivity type positioned in the middle of said second emitter regions respectively, which are in ohmic contact with said second main electrode and extend to said second base region respectively.

5. A gate turn-off thyristor as claimed in claim 1, wherein said second base region comprises a first portion including said exposed surface to said second main electrode and a second portion adjacent to said first portion remote from said exposed surface, in which the resistivity of said first portion is lower than that of said second portion.

6. A gate turn-off thyristor as claimed in claim 5, wherein said first portion of said second base region protrudes from said second emitter regions towards said one major surface.

7. A gate turn-off thyristor as claimed in claim 1, wherein said one major surface has a recess at said exposed surface of said first base region, the bottom of which recess said gate electrode is disposed on.

8. A gate turn-off thyristor as claimed in claim 1, wherein said semiconductor substrate has further semiconductor regions of said opposite conductivity type having strip-shapes, which further semiconductor regions are exposed to said second main electrode and interconnect said second emitter regions, respectively.

9. A gate turn-off thyristor as claimed in claim 2, wherein a gate wire is electrically connected to said gate electrode at a portion close by said center of said radial arrangement, and a pair of external main electrodes are electrically connected to said first main electrodes and said second main electrode respectively.

10. A gate turn-off thyristor as claimed in claim 2, wherein said second emitter regions substantially overlap the projections of said first emitter regions onto said other major surface.

11. A gate turn-off thyristor as claimed in claim 2, wherein a width of said exposed portion of said at least one strip-shaped portion of said first emitter regions remains substantially constant along a length of said strip-shaped portion.

12. A gate turn-off thyristor which comprises:
 (a) a semiconductor substrate having a pair of opposing major surfaces which comprises:
  (i) a plurality of first emitter regions of one conductivity type exposed to one of said major surfaces exposed area, said first emitter regions having strip-shapes on said one major surface;
  (ii) a plurality of second emitter regions of opposite conductivity type to said first emitter regions exposed to the other of said major surfaces, and having portions of strip-shapes which overlap respectively projections of said first emitter regions onto said other major surface;
  (iii) a first base region of said opposite conductivity type adjacent to said first emitter regions and exposed to said one major surface so as to surround the exposed surface of said first emitter regions; and
  (iv) a second base region of said one conductivity type adjacent to said first base region and said second emitter regions, and exposed to said other major surface so as to surround exposed surfaces of said second emitter regions and so as to have a portion where an area of the exposed surface of said second base region is increased in a substantially continuous manner along a longitudinal direction of at least one of said strip-shaped portions of said second emitter regions from one portion close to one side of a terminal edge of said at least one strip-shaped portion of said second emitter regions to another portion close to another side of said terminal edge of said at least one strip-shaped portion of said second emitter regions,
 (b) a plurality of first main electrodes disposed on said one major surface of said semiconductor substrate in ohmic contact with the exposed surfaces of said first emitter regions;
 (c) a second main electrode disposed on said other major surface of said semiconductor substrate in ohmic contact with the exposed surfaces of said second emitter regions and said second base region; and
 (d) a gate electrode disposed on said one major surface in ohmic contact with the exposed surface of said first base region, to which gate electrode an external gate wire is to be electrically connected at at least one corresponding portion of said gate electrode close to said one side of terminal edges of said second emitter regions,
 wherein said first emitter regions are arranged radially, and said second base region is exposed to said other major surface so as to increase the area of the exposed surface in a substantially continuous manner along a longitudinal direction of said at least one strip-shaped portion of said second emitter regions from a portion close to a center of said radial arrangement to another portion close to a periphery of said radial arrangement; and
 wherein a width of said exposed portion of said at least one strip-shaped portion of said first emitter regions remains substantially constant along a length of said strip-shaped portion.

* * * * *